(12) United States Patent
Nagata et al.

(10) Patent No.: US 7,035,081 B2
(45) Date of Patent: Apr. 25, 2006

(54) SEMICONDUCTOR DEVICE (75) Inventors: Tatsuya Nagata, Tsuchiura (JP); Seiji Miyamoto, Ome (JP); Hideko Ando, Ome (JP)

(73) Assignee: Hitachi, Ltd., Tokyo (JP)

( * ) Notice: Subject to any disclaimer, the term of this patent is extended or adjusted under 35 U.S.C. 154(b) by 139 days.

(21) Appl. No.: 10/478,800

(22) PCT Filed: May 28, 2002

(86) PCT No.: PCT/JP02/05163

§ 371 (c)(1),
(2), (4) Date: Nov. 25, 2003

(87) PCT Pub. No.: WO02/099876

PCT Pub. Date: Dec. 12, 2002

(65) Prior Publication Data

US 2004/0169198 A1 Sep. 2, 2004

(30) Foreign Application Priority Data

May 30, 2001 (JP) .............................. 2001-161914

(51) Int. Cl.
*H01G 4/228* (2006.01)
(52) U.S. Cl. .................. 361/306.3; 257/200; 257/698; 361/306.1
(58) Field of Classification Search ................ 174/262; 257/698, 773, 200; 361/306.3, 306
See application file for complete search history.

(56) References Cited

U.S. PATENT DOCUMENTS

| 5,331,514 | A | 7/1994 | Kuroda |
| 6,388,207 | B1 * | 5/2002 | Figueroa et al. ............ 174/262 |
| 6,611,419 | B1 * | 8/2003 | Chakravorty ............ 361/306.3 |

* cited by examiner

*Primary Examiner*—David Nelms
*Assistant Examiner*—Dao H. Nguyen
(74) *Attorney, Agent, or Firm*—Townsend and Townsend and Crew LLP (57) ABSTRACT The invention eliminates a need to increase a size of a semiconductor device and reduces occurrence of noise. A semiconductor device of the invention includes: a base (5) having front layers (9, 11) provided on respective sides of a core layer (7) formed by a printed circuit board, and a semiconductor chip (1) mounted on the base (5), wherein the semiconductor chip (1) is joined to one (9) of the front layers by using a joining member (3), and the other front layer (11) has a plurality of external terminals (55) arranged thereon, and the core layer (7) has a plurality of through-holes (41, 43, 45, 75, 77) formed therein to electrically connect the semiconductor chip (1) to the plurality of external terminals (55) together, and the plurality of through-holes (41, 43, 45, 75, 77) include a plurality of arrayed through-holes (41, 43, 45) arranged correspondingly to the arrangement of the plurality of external terminals (55) and one or more additional through-holes (75, 77) formed between the plurality of arrayed through-holes (41, 43, 45).

4 Claims, 5 Drawing Sheets

SEMICONDUCTOR DEVICE

TECHNICAL FIELD

The present invention relates to a semiconductor device.

BACKGROUND ART

Ball grid array semiconductor devices (hereinafter referred as BGA semiconductor devices), pin grid array semiconductor devices (hereinafter referred as PGA semiconductor devices), land grid array semiconductor devices (hereinafter referred as LGA semiconductor devices), chip scale package semiconductor devices (hereinafter referred as CSP semiconductor devices), or the like in which terminals are formed in the form of grids are widely used because they can accommodate an increased number of signal lines or for other reasons.

In these semiconductor devices, in order to decrease electrical noise, in addition to first ground through-holes electrically connected to a ground layer, it has been proposed to provide a plurality of second ground through-holes electrically connected to the ground layer in a ground pattern provided in a predetermined site of a bottom surface thereof, as the semiconductor device described in JP-A-7-153869. For example, in the semiconductor device described in JP-A-7-153869, noise occurrence can be suppressed by expanding an area of the ground layer through which current effectively flows.

DISCLOSURE OF INVENTION

However, in these semiconductor devices, a ground pattern is provided so as to surround circumference of each electrode and second ground through-holes electrically connecting to a ground layer are formed in the ground pattern, and therefore, the semiconductor devices become larger by an amount of the ground pattern having been provided. When the semiconductor devices become larger, there are problems that the cost of the semiconductor devices increase and mounting area of the semiconductor devices become larger, thereby increasing cost of electronic apparatus in which the semiconductor devices are mounted.

It is an object of the present invention to prevent the semiconductor devices from becoming large in scale and to reduce noise occurrence.

The present invention attains the above-described object by the following means. The present invention provides a semiconductor device including a base having front layers provided on respective sides of a core layer formed by a printed circuit board, and a semiconductor chip mounted on the base, wherein the semiconductor chip is joined to one of the front layers by a joining member, a plurality of external terminals are arranged on the other front layer, a plurality of through-holes electrically connecting the semiconductor chip to the plurality of external terminals are formed in the core layer, and the plurality of through-holes includes a plurality of arrayed through-holes arranged correspondingly to an arrangement of the plurality of external terminals and one or more additional through-holes formed between the plurality of arrayed through-holes.

In this manner, in addition to the arrayed through-holes arranged correspondingly to the arrangement of the external terminals, self external terminals, i.e. additional through-holes having no corresponding external terminals are formed between the arrayed through-holes in the core layer of the base. Consequently, the additional through-holes can be formed in the vicinity of the arrayed through-holes, thereby reducing inductance. Further, the additional through-holes have no corresponding external terminals, and therefore, it is possible to reduce the number of external terminals in the semiconductor chip as well as its size, in comparison with the case where external terminals or patterns for the through-holes are formed on a surface of the base. As a result, it is possible to avoid the semiconductor device being made larger and to reduce inductance and thus to reduce occurrence of noise in the semiconductor device.

Further, in the semiconductor device of the present invention, the plurality of external terminals comprise external signal terminals, external power terminals, and external ground terminals, and the plurality of through-holes may include signal through-holes electrically connecting the external signal terminals and the semiconductor chip, power through-holes electrically connecting the external power terminals and the semiconductor chip, ground through-holes electrically connecting the external ground terminals and the semiconductor chip, and additional through-holes electrically connecting the external power terminals and the semiconductor chip or the external ground terminals and the semiconductor chip. In this case, the number of through-holes may be larger than that of external terminals by the number of additional through-holes.

Thus, the plurality of through-holes including the signal through-holes electrically connecting the external signal terminals and the semiconductor chip, the power through-holes electrically connecting the external power terminals and the semiconductor chip, the ground through-holes electrically connecting the external ground terminals and the semiconductor chip, and the additional through-holes electrically connecting the external power terminals and the semiconductor chip or the external ground terminals and the semiconductor chip is provided in number larger than that of external terminals by the number of the additional through-holes. Therefore, it is possible to reduces the inductance of a ground or power by an amount corresponding to the additional through-holes, thereby reducing occurrence of noise in the semiconductor device. Further, it is also possible to prevent the semiconductor device from becoming large by an amount of no external terminals being provided.

Further, in the semiconductor device of the present invention, the plurality of through-holes includes a plurality of arrayed through-holes arranged correspondingly to the arrangement of the plurality of external terminals, and one or more additional through-holes formed between the arrayed through-holes. The plurality of through-holes is provided in number larger than that of external terminals by the number of the additional through-holes. The plurality of arranged through-holes includes arrayed signal through-holes which electrically connect the external signal terminals and the semiconductor chip and are arranged correspondingly to the arrayed external signal terminals, arrayed power through-holes which electrically connect the external power terminals and the semiconductor chip and are arranged correspondingly to the arrayed external power terminals, and arrayed ground through-holes which electrically connect the external ground terminals and the semiconductor chip and are arranged correspondingly to the arrayed external ground terminals. The additional through-holes may be arranged between the arrayed signal through-holes which are provided in an array and electrically connect the external power terminals and the semiconductor chip or the external ground terminals and the semiconductor chip.

Thus, the through-holes are formed in the core layer of the base in number larger than that of external terminals by the number of the additional through holes, thereby reducing the inductance of the ground and power by the amount corresponding to the additional through-holes. Further, since the additional through-holes are formed between the arrayed signal through-holes, it is possible to provide in the vicinity of the arrayed signal through-holes and to reduce the inductance of the ground or the power. Furthermore, since the additional through-holes have no self external terminals, it is possible to make the size of the semiconductor device small in comparison with the case in which external terminals and patterns are formed on the base surface. This eliminates the need to increase the size of the semiconductor device and an electronic apparatus in which the semiconductor device is mounted, thus suppressing an increase in costs. Moreover, if the external terminals have a larger diameter than the through-holes, the additional through-holes can be formed in the vicinity of the arrayed signal through-holes by an amount that they have no self external terminals in comparison with the arrayed power through-holes and arrayed ground through-holes having self external terminals, thereby reducing the inductance of the ground or the power.

Further, in the semiconductor device of the present invention, the base may be divided into a plurality of areas, in which the arrayed through-holes may be formed, with the additional through-holes formed between the areas in which the arrayed through-holes are formed.

The base is thus divided into a plurality of areas, between which the additional through-holes are formed. Correspondingly, in comparison with the case where the ground through-holes are formed in the periphery of the base, the additional through-holes can be formed close to the arrayed through-holes corresponding to the external terminals located in a central portion, thus reducing inductance. Further, no external terminals corresponding to the additional through-holes are provided, thereby eliminating the need to increase the size of the semiconductor device.

Further, in the semiconductor device of the present invention, the additional through-holes may be formed close to diagonal lines of the base, shaped in a general rectangle. By thus dividing the base into a plurality of areas using the diagonal lines and forming the additional through-holes between these areas, the additional through-holes can be formed without substantially changing the wiring in a conventional semiconductor device. These areas are not limited to those obtained by dividing the base along the diagonal lines, but the base may be divided so as not to substantially change the wiring on the base. For example, the base may be divided into four using two orthogonal lines so that the divided areas are each generally rectangular.

Further, if the arrayed through holes in the semiconductor device comprises main power through-holes formed in the central portion, signal through-holes formed around the main power through-holes, and power through-holes and ground through-holes formed between these signal through-holes, then the base may be divided into an area for the central power through-holes and an area for the peripheral signal through-holes, with the additional through-holes formed between the power through-hole area and the signal through-hole area. Then, the signal through-hole area may further be divided into smaller pieces using the diagonal lines of the base or the like so that the additional through-holes can be formed between these pieces. In this case, each piece of the divided signal through-hole area preferably has substantially the same size and substantially the same number of arrayed through-holes.

Furthermore, the core layer is preferably provided with signal through-holes the number of which is equal to or less than four times as large as the total number of power through-holes, ground through-holes, and additional through-holes. For example, if a plurality of signal through-holes are formed in the core layer with ground through-holes formed close to these signal through-holes, then when currents flow through the plurality of signal through-holes, these plurality of currents induce currents flowing through the ground through-holes. The currents flowing through the ground through-holes are not preferable because their current paths superimpose and inductance becomes large. If the number of signal through-holes is equal to or less than four times as large as the total number of additional through-holes, power through-holes, and ground through-holes, then an increase in inductance of the ground or power caused by the superimposed current paths can be reduced.

Other objects, features and advantages of the invention will become apparent from the following description of the embodiments of the invention taken in conjunction with the accompanying drawings.

BEST MODE FOR CARRYING OUT THE INVENTION

Embodiments of the present invention will be described with reference to FIGS. 1 to 5.

Figure 1:
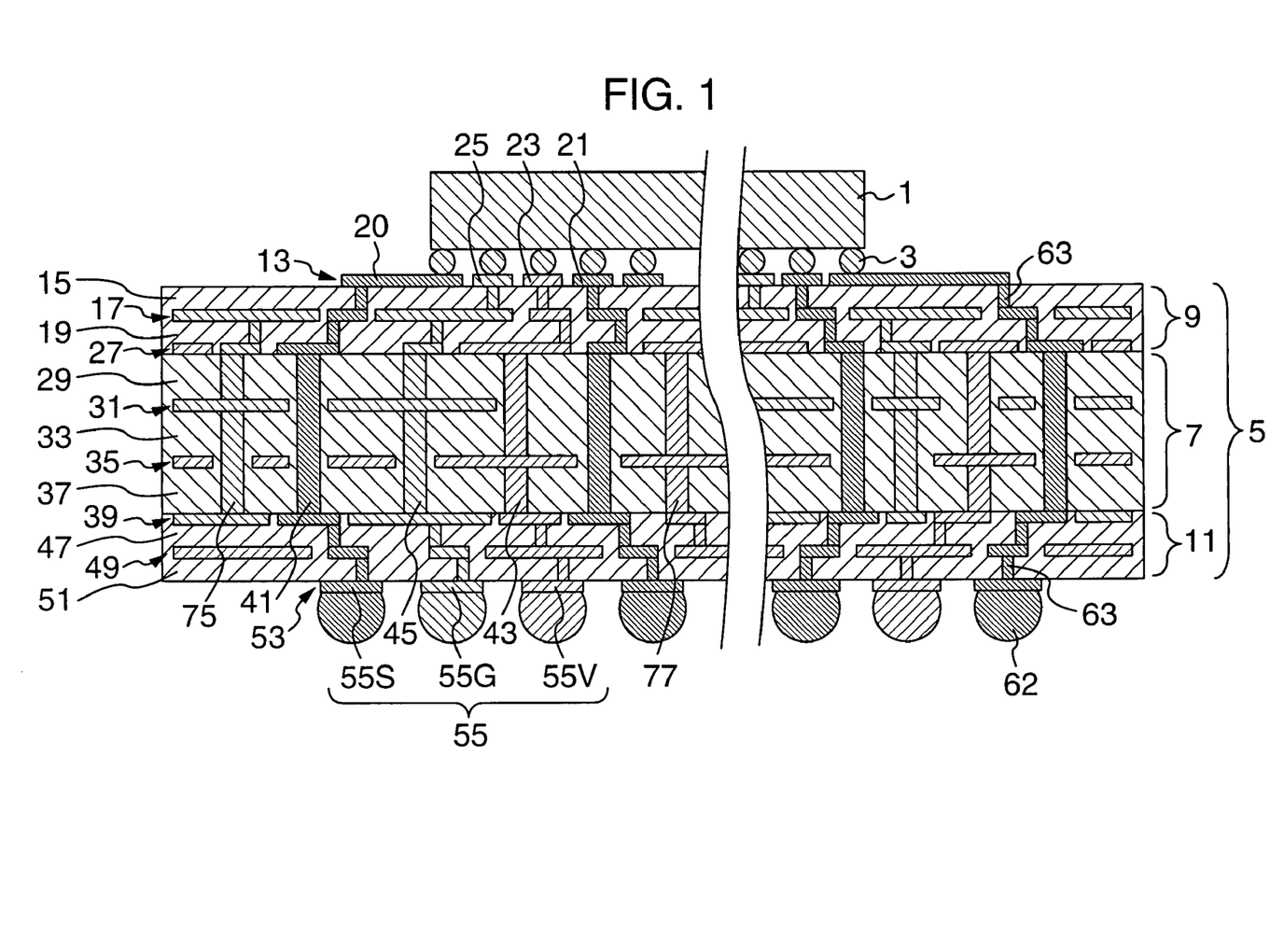
FIG. 1 is a vertical sectional view schematically showing a configuration of a semiconductor device according to an embodiment of the present invention.

A BGA semiconductor device according to the embodiment comprises a semiconductor chip 1 and a base 5 joined to the semiconductor chip 1 using joining members, for example, solder balls 3, as shown in FIG. 1.

The semiconductor chip 1 has terminals (not shown) provided all over a surface thereof facing the base 5, and the terminals (not shown) are arranged in a grid form.

The base 5, which electrically connects the terminals (not shown) arranged on the semiconductor chip 1 in a grid form, to a motherboard or the like of an electronic apparatus by increasing the interval between the terminals, i.e. the pitch thereof, comprises a core layer 7 formed by a printed circuit board and front layers 9 and 11 provided on the respective sides of the core layer 7 and in which dense wiring can be formed.

One of the front layers 9 and 11 provided on the respective sides of the core layer 7 which faces the semiconductor chip 1 is joined to the semiconductor chip 1 using solder balls 3 which are joining members. An insulator such as epoxy resin (not shown) is filled and sealed between the semiconductor chip 1 and each front layer 9.

The plurality of terminals (not shown) of the semiconductor chip 1 include a signal terminal, a power terminal, and a ground terminal, and are provided on the surface of the semiconductor chip 1 which faces the base 5.

The front layer 9 has, for example, a conductor layer 13 connecting to the terminal (not shown) of the semiconductor chip 1 provided on a front surface of the front layer 9, i.e. a surface opposite to the semiconductor chip 1, and an insulator layer 15, a conductor layer 17, and an insulator layer 19 formed in this order from the semiconductor chip 1 toward the core layer 7 of the base 5, with the conductor and insulator layers alternately stacked together.

The conductor layer 13 comprises a signal line 20, a signal terminal 21, a power terminal 23, and a ground terminal 25. The signal terminal 21, power terminal 23 and ground terminal 25 in the conductor layer 13 are provided opposite the signal terminal, the power terminal, and the ground terminal (not shown), respectively, provided on the semiconductor chip 1, and are connected thereto using solder balls 3.

The conductor layer 17 comprises a plane ground conductor layer, and a signal conductor layer and a power conductor layer both provided in openings formed in the plane ground conductor layer.

The core layer 7 has a conductor layer 27 formed in a front surface thereof, i.e. a surface thereof which is in contact with the insulator layer 19 of the front layer 9, and an insulator layer 29, a conductor layer 31, an insulator layer 33, a conductor layer 35, an insulator layer 37, and a conductor layer 39 formed under the conductor layer 27 in this order from the front layer 9 toward the front layer 11, with the conductor and insulator layers alternately stacked together.

The conductor layer 27 comprises a plane power conductor layer, and a signal conductor layer and a ground conductor layer both provided in openings formed in the plane power conductor layer.

The conductor layer 31 comprises a plane ground conductor layer, and a power conductor layer provided in openings formed in the plane power conductor layer.

The conductor layer 35 comprises a plane power conductor layer and a ground conductor layer provided in openings formed in the plane power conductor layer.

The conductor layer 39 comprises a plane power conductor layer, a signal conductor layer and a power conductor layer both provided in openings formed in the plane ground conductor layer.

Further, the core layer 7 is provided with arrayed signal through-holes 41 which electrically connect the signal conductor layers provided on the respective sides of the core layer 7, arrayed power through-holes 43 which electrically connect the plane power conductor layer provided in the core layer 7 and power conductor layers, and arrayed ground through-holes 45 which electrically connect the plane ground conductor layer provided in the core layer 7 and ground conductor layers.

The arrayed signal through-holes 41, arrayed power through-holes 43, arrayed ground through-holes 45, and others in the core layer 7 are formed by, for example, having formed recesses in a plane conductor layer not to be connected, using a drill to form through-holes penetrating the recesses in the conductor, and forming copper at the inner surfaces of the through-holes by an electroless copper plating process. In this case, the plane conductor layer and the copper provided on the inner surface of each through-hole is isolated by an insulator. Further, no recesses are formed in a plane conductor layer to be connected, and penetrating through-holes are similarly formed using the drill. In this case, since an end surface of the plane conductor layer is exposed at the inner surface of each through-hole, the through-holes and the plane conductor layer are connected together by covering the inner surfaces of the through-holes with the copper by electroless copper plating. In this way, the through-holes in the core layer 7 are formed by forming a hole in the print wiring board by using the drill and by plating this hole.

The arrayed signal through-holes 41 electrically connect together the signal conductor layers provided on the respective sides of the core layer 7, i.e. the signal conductor layers of the conductor layers 27 and 39.

The arrayed power through-holes 43 electrically connect together the plane power conductor layer provided on the surface of the core layer 7 which is closer to the semiconductor chip 1, i.e. the plane power conductor layer of the conductor layer 27 and the plane power conductor layer of the conductor layer 35 and the power conductor layer provided on a surface of the core layer 7 which is closer to the front layer 11, i.e. the plane power conductor layer of the conductor layer 39.

The arrayed power through-holes 45 electrically connect together the ground conductor layer provided on the surface of the core layer 7 which is closer to the semiconductor chip 1, i.e. the ground conductor layer of the conductor layer 27 and the plane ground conductor layer provided on the bottom surface of the core layer 7, i.e. the plane ground conductor layer of the conductor layer 39.

The front layer 11, for example, like the front layer 9, has an insulator layer 47 provided on a surface thereof which is in contact with the core layer 7, and a conductor layer 49, an insulator layer 51, and a conductor layer 53 formed under the insulator layer 47 in this order from the core layer 7 toward the bottom surface of the base 5, with the conductor and insulator layers alternately stacked.

The conductor layer 49 comprises a plane power conductor layer, and a signal conductor layer and a ground conductor layer both provided in openings formed in the plane power conductor layer.

The conductor layer 53 comprises external terminals 55 such as external signal terminals 55s, external power terminals 55v, and external ground terminals 55g, with the external terminals 55 having solder balls 62 joined thereto. The solder balls 62 are used to connect the semiconductor device to a substrate of an electronic apparatus (not shown).

Further, the front layer 9 is formed with vias 63 to electrically connect together the conductor layers 13 and 17, insulated from each other by the insulator layer 15, and electrically connect together the conductor layer 17 and the conductor layer 27 of the core layer 7, insulated from each other by the insulator layer 19. The front layer 11 is formed with vias 63 to electrically connect together the conductor layer 39 of the core layer 7 and the conductor layer 49 of the front layer 11, insulated from each other by the insulator layer 47, and electrically connect together the conductor layers 49 and 53, insulated from each other by the insulator layer 53.

The via 63 is formed by forming a hole in the insulator layer using photolithography or a laser, covering all the surface with copper by an electroless copper process, and etching the copper by photolithography. The hole in the insulator layer results a recess in a surface of a layer formed on the insulator layer. Owing to photolithographical restrictions, a short wire is provided in the hole in the plane conductor layer, and a via extending to the upper layer is caused to deviate from a via extending to the lower layer to disperse the amount of the recess.

In this case, a signal connection path starts with a signal terminal (not shown) of the semiconductor device, passes through the solder ball 3, conductor layer 13, via 63, signal conductor layer of the conductor layer 17, via 63, signal conductor layer of the conductor layer 27, arrayed signal through-hole 41, signal conductor layer of the conductor layer 39, via 63, signal conductor layer of the conductor layer 49, via 63, and external signal terminal 55s of the conductor layer 53, and ends with the solder ball 62. The signal terminals (not shown) of the semiconductor chip 1 are connected to the external signal terminals 55s, acting as output terminals of the semiconductor device, of the conductor layer 53 on a one-by-one correspondence.

A power connection path starts with a power terminal (not shown) of the semiconductor device 1, passes through the solder ball 3, conductor layer 13, via 63, power conductor layer of the conductor layer 17, via 63, plane power conductor layer of the conductor layer 27, arrayed power through-hole 43, plane power conductor layer of the conductor layer 35, arrayed power through-hole 43, power conductor layer of the conductor layer 39, via 63, plane power conductor layer of the conductor layer 49, via 63, and external signal terminal 55s of the conductor layer 53, and ends with the solder ball 62.

A ground connection path starts with a ground terminal (not shown) of the semiconductor device, passes through the solder ball 3, conductor layer 13, via 63, plane ground conductor layer of the conductor layer 17, via 63, power conductor layer of the conductor layer 27, arrayed ground through-hole 45, plane ground conductor layer of the conductor layer 31, arrayed ground through-hole 45, plane ground conductor layer of the conductor layer 31, arrayed ground through-hole 45, plane ground conductor layer of the conductor layer 39, via 63, ground conductor layer of the conductor layer 49, via 63, and external signal terminal 55g of the conductor layer 53, and ends with the solder ball 62.

In this manner, the power is connected through the via 63 and arrayed power through-hole 43 to the plane power conductor layers of the conductor layers 27, 35, and 49, and the ground is connected through the via 63 and arrayed ground through-hole 45 to the plane ground conductor layers of the conductor layer 17, 31, and 39. Further, the plane conductor layer has a large number of holes in which conductors are formed so that signal lines from the conductors can be connected to another layer.

Figure 2:
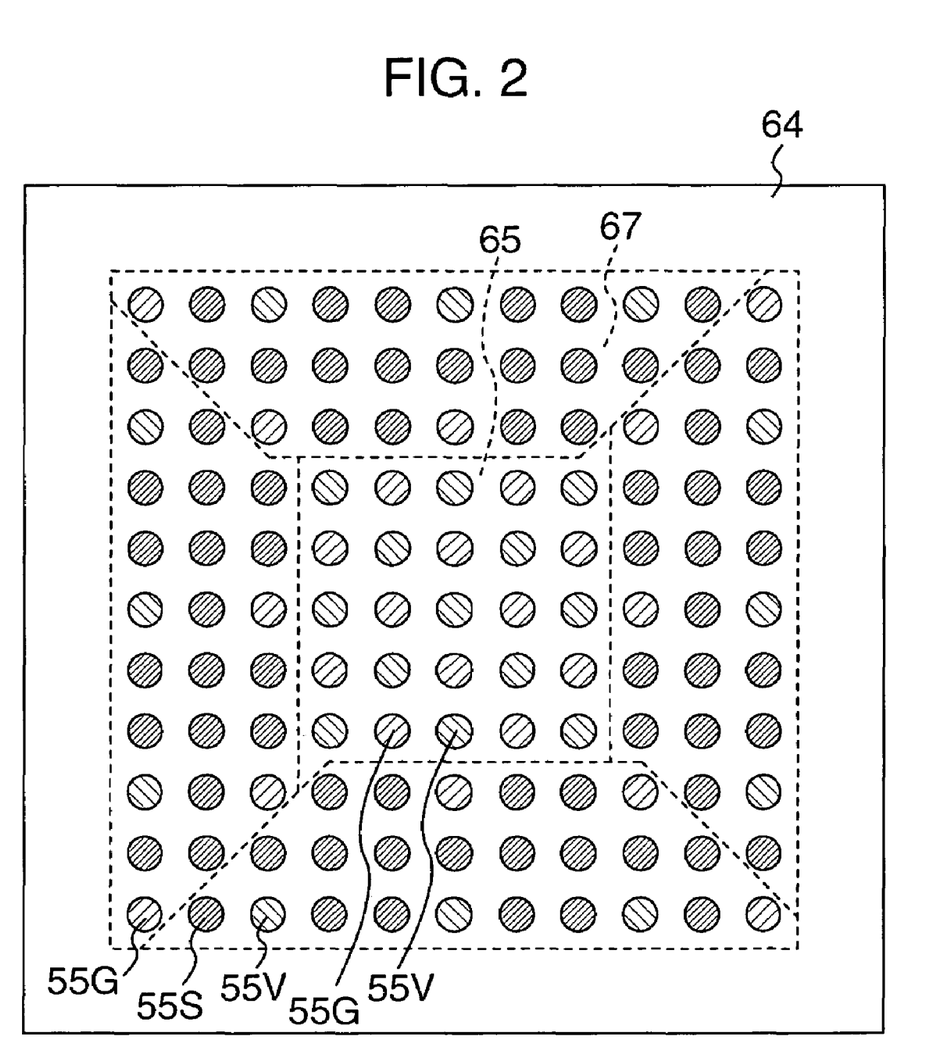
FIG. 2 is a bottom view of the semiconductor device in FIG. 1.

The external terminals 55, which form the conductor layer 53 of the front layer 11, are arranged on the front surface of the front layer 11, i.e. the bottom surface 64 of the semiconductor device in a grid form, as shown in FIG. 2. For example, 11×11=121 external terminals are provided. Further, in FIG. 2, for explanation purpose, the solder balls 62 are omitted. The bottom surface 64 of the semiconductor device, on which the external terminals 55 are provided in a grid form, is divided into an internal power area 65 formed in a central portion thereof as a general rectangle and signal line area 67 formed around the internal power area 65. The signal line area 67 is divided into four near diagonal lines of the base 5.

The internal power area 65, formed in the central portion of the bottom surface 64 of the semiconductor device, has 25 terminals arranged in the form of a 5×5 grid and including the external power terminals 55v and external ground terminals 55g. The external power terminals 55v and the external ground terminals 55g are arranged adjacent to each other so that the external ground terminals 55g surround the external power terminals 55v. On the other hand, the external power terminals 55v are arranged so as to surround the external ground terminals 55g. That is, the external power terminals 55v and external ground terminals 55g, the numbers of which are substantially the same, are alternately arranged within the internal power area 65.

The signal line area 67, formed around the internal power area 65, is divided into four pieces by diagonal lines of the bottom surface 64 of the semiconductor device. Each piece of the divided signal line area 67 has the external signal terminals 55s, external power terminals 55v, and external ground terminals 55g arranged therein. The signal line area 67 has the external ground terminals 55g arranged at substantially uniform intervals in an inner peripheral portion thereof adjacent to the internal power area 65 and on the diagonal line of the bottom surface 64. That is, the external ground terminals 55g are provided in corners of the signal line area 67 which are closer to the internal power area 65 and in external corners thereof. The external ground terminal 55g is also provided midway between the external ground terminals 55g provided in the internal-power-area-65-side corners of the signal line are 67. Between the external ground terminals 55g located in the signal line area 67 and closer to the internal power area 65, two external signal terminals 55s are arranged, for example. Furthermore, the external ground terminals 55g located in the signal line area 67 and closer to the internal power area 65 are arranged adjacent to the corresponding external power terminals 55v in the internal power area 65. Further, the external power terminals 55v provided in the internal power area 65 are arranged in an outer peripheral portion of the signal line area 67 at substantially uniform intervals, with the external signal terminals 55s arranged between the external power terminals 55v provided in the outer peripheral portion of the signal line area 67. In this manner, the external power terminals 55v and external ground terminals 55g, the numbers of which substantially the same, are provided within the signal line area 67, and the external signal terminals 55s, the number of which are substantially three times as large as the total number of external power terminals 55v and external ground terminals 55g, are provided. The external signal terminals 55s are provided around the external power terminals 55v and external ground terminals 55g so as to lie adjacent thereto.

The operation of the semiconductor device of this embodiment and the characteristic portions of the present invention will be described below. The semiconductor device of this embodiment has arrayed signal through-holes 41 provided correspondingly to the external signal terminals 55s, arrayed power through-holes 43 provided correspondingly to the external power terminals 55v, arrayed ground through-holes 45 provided correspondingly to the external ground terminals 55g, additional ground through-holes 75 having no corresponding external terminals 55, and additional power through-holes 77 having no corresponding external terminals 55, as shown in FIG. 3.

Figure 3:
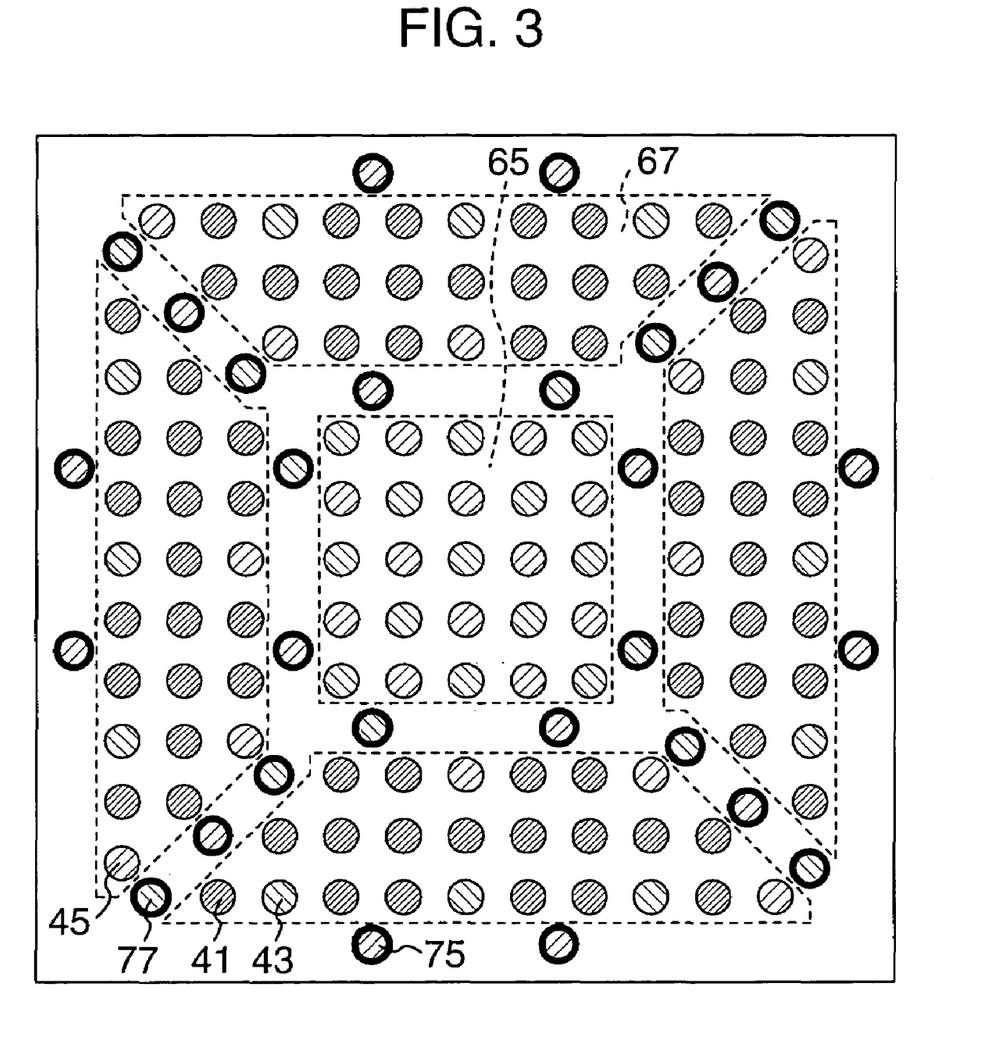
FIG. 3 is a horizontal sectional view schematically showing the configuration of the semiconductor device in FIG. 1.

The number of additional ground through-holes 75 electrically connecting together the plurality of ground conductor layers formed in the core layer 7 is substantially the same as that of additional power through-holes 77 also electrically connecting together the plurality of ground conductor layers formed in the core layer 7, as shown in FIG. 3.

As shown in FIG. 1, the additional ground through-holes 75 electrically connect together the ground conductor layer of the conductor layer 27, provided in the front surface of the core layer 7, and the plane ground conductor layer of the conductor layer 39, provided in the bottom surface of the core layer 7, as well as the plane ground conductor layer of the conductor layer 31, contained in the core layer 7. Further, the additional ground through-holes 75 have no corresponding external terminals 55, but are electrically connected to the arrayed ground through-holes 45 and external ground terminals 55g through the plane ground conductor layers of the conductor layers 31 and 39.

The additional ground through-holes 77 electrically connect together the plain power conductor layer of the conductor layer 27, provided in the front surface of the core layer 7, and the power conductor layer of the conductor layer 39, provided in the bottom surface of the core layer 7, as well as the plane power conductor layer of the conductor layer 35, contained in the core layer 7. Further, the additional power through-holes 77 have no corresponding external terminals 55, but are electrically connected to the arrayed power through-holes 43 and external power terminals 55v through the plane power conductor layers of the conductor layers 27 and 35.

The arrayed signal through-holes 41, arrayed power through-holes 43, and arrayed ground through-holes 45 are arranged substantially similarly to the external signal terminals 55s, external power terminals 55v, and external ground terminals 55g, shown in FIG. 2. Further, the pieces of the signal line area 67 divided using the diagonal lines are deviated from the internal power area 65 toward the outer periphery of the base 5. In this case, provided that the interval between the through-holes arranged in a grid form is one pitch, by deviating the pieces of the divided signal line area 67 by about half a pitch toward the outer periphery of the base, gaps are formed between the internal power area 65 and each piece of the signal line area 67 and between the pieces of the divided signal line area 67, with the additional ground through-holes 75 and additional power through-holes 77 formed in these gaps. The additional ground through-holes 75 and additional power through-holes 77 do not have any self terminals, i.e. the corresponding terminals (not shown) of the semiconductor chip 1 or the corresponding external terminals 55 and are formed in the core layer 7, as shown in FIG. 1.

That is, as shown in FIG. 3, the relative arrangement of the arrayed signal through-holes 41, arrayed power through-holes 43, and arrayed ground through-holes 45 substantially coincides with the arrangement of the external terminals 55 in FIG. 2. The additional ground through-holes 75 and the additional power through-holes 77 are arranged at positions that are absent from the arrangement of the external terminals 55.

The additional ground through-holes 75 and the additional power through-holes 77 are alternately provided between the internal power area 65 and each piece of the signal line area 67, i.e. around the internal power area 65. Further, the additional ground through-holes 75 and the additional power through-holes 77 are provided between the pieces of the signal line area 67, that is, on the diagonal lines of the base 5. Two additional power through-holes 77 are provided on each of the diagonal lines of the base 5, with the additional ground through-hole 76 provided between the two additional power through-holes 77. Furthermore, the additional ground through-holes 75 are provided around the signal line area 67 at substantially uniform intervals.

Figure 4:
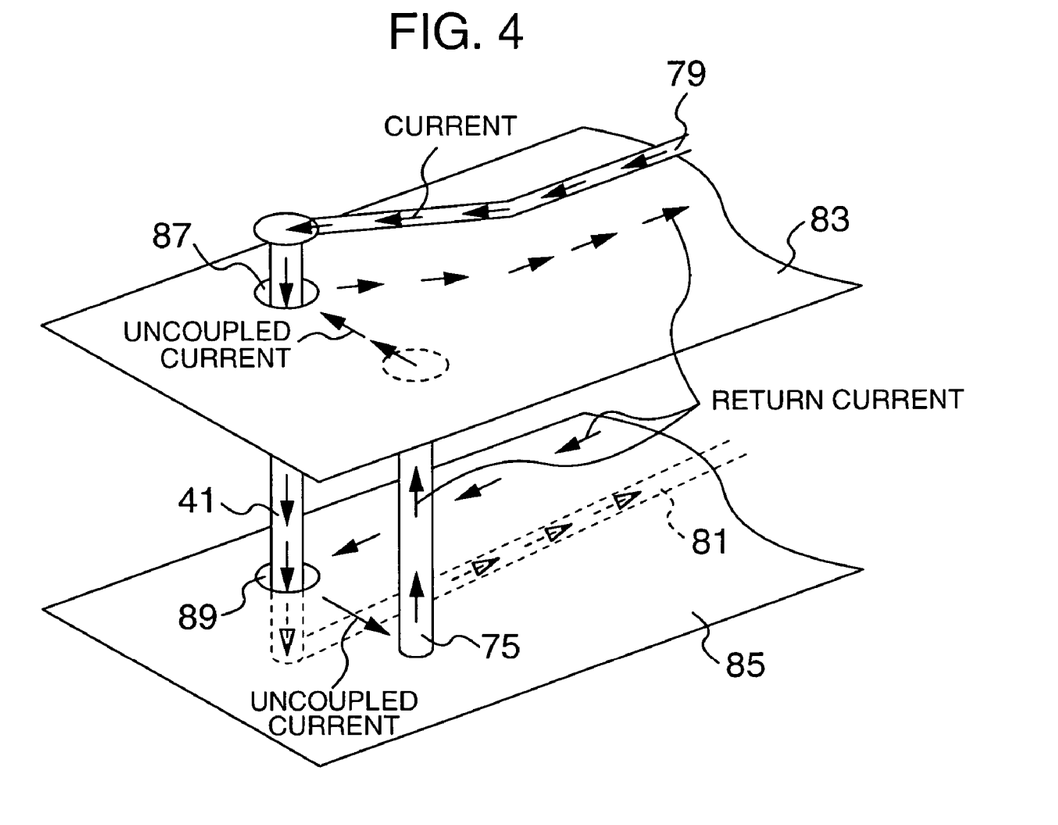
FIG. 4 is a schematic perspective view illustrating an operation of the semiconductor device in FIG. 1.

Next, the operation of the BGA semiconductor device of this embodiment will be described with reference to FIG. 4. In FIG. 4, to describe the operation of the BGA semiconductor chip, the configuration of the base 5 has been simplified. FIG. 4 shows signal lines 79 and 81 in the conductor layers 13 and 49, an arrayed signal through-hole 41 electrically connected to the signal lines 79 and 81, plane ground conductor layers 83 and 85 of the conductor layers 17 and 39, and an additional ground through-hole 75 electrically connected to the plane ground conductor layers 83 and 85, with the other constituent members omitted.

As shown in FIG. 4, the base 5 comprises the signal line 79 in the conductor layer 13, the plane ground conductor layer 83 of the conductor layer 17, the plane ground conductor layer 85 of the conductor layer 39, and the signal line 81 in the conductor layer 49, with insulator layers (not shown) provided between these conductor layers. Further, the signal line 79 in the conductor layer 13 and the signal line 81 in the conductor layer 49 are electrically connected together via the arrayed signal through-hole 41, and the plane ground conductor layer 83 of the conductor layer 17 and the plane ground conductor layer 85 of the conductor layer 39 are electrically connected together via the additional ground through-hole 75. The plane ground conductor layers 83 and 85 of the conductor layers 17 and 39 are respectively formed with openings 87 and 89 in which the arrayed signal through-hole 41 is formed. The arrayed signal through-hole 41 is not electrically connected to the plane ground conductor layers 83 and 85.

With regard to the signal inputs to and signal outputs from the semiconductor chip 1, for example, when the voltage of a signal is switched from L (Low) to H (High), current flows through the signal line 79, in the vicinity of the semiconductor chip 1, in the conductor layer 13 connected to the semiconductor chip 1, return current is induced in the plane ground conductor layer 83 of the conductor layer 17, located opposite the signal line 79, to flow in the direction opposite to that of the current flowing through the signal line 79.

If the signal line 79 and the plane ground conductor layer 83 located close thereto are provided, then when transient current flows through the signal line 79, a magnetic field is generated to cause induced current to flow through the plane ground conductor layer 83. The induced current flows through the plane ground conductor layer 83 in the direction opposite to that of the current flowing through the signal line 79 so as to minimize the magnetic field caused by the transient current. This opposite current is referred as the "return current". This also applies to induced current flowing through the additional ground through-hole 75 and plane ground conductor layer 85.

The current flowing through the signal line 79 in the conductor layer 13 and the return current flowing through the plane ground conductor layer 83 of the conductor layer 17 form a continuous current loop via an electrostatic capacity between these currents. The current upon signal switching flows to the vicinity of the semiconductor chip 1 and propagates away therefrom over time. That is, within the same single signal line, current flows through those portions to which the signal has propagated but not through those portions to which the signal has not propagated. The return current flows through the plane ground conductor layer 83 of the conductor layer 17, located opposite the signal line 79 in the conductor layer 13, and the current through the signal line 79 and the return current typically form a pair. Once the current through the signal line 79 reaches the arrayed signal through-hole 41, the return signal flowing through the opposite plane ground conductor layer 83 reaches the opening 87 in the plane ground conductor layer 83, in which the arrayed signal through-hole 41 is formed.

The current which has reached the arrayed signal through-hole 41 conducts through the through-hole 41 because there is a current path in the arrayed signal through-hole 41, while inducing the return current of opposite direction in the additional ground through-hole 75. The current flows through the arrayed signal through-hole 41 to reach the signal line 81 in the conductor layer 49. The current which has reached the signal line 81 conducts through the signal line 81 in the conductor layer 49 because there is a current path in the signal line 81, and propagates away from the arrayed signal through-hole 41 over time. The current flowing through the signal line 81 simultaneously induces the return current of opposite direction in the plane ground conductor layer of the conductor layer 39. The current flowing through the signal line 81 in the conductor layer 49 and the return current flowing through the plane ground conductor layer 85 of the conductor layer 39 form a continuous current loop via an electrostatic capacity between these currents.

The return current flowing through the plane ground conductor layer 85 flows in the direction opposite to that of the current flowing through the signal line 81 in the conductor layer 49, and thus flows toward the arrayed signal through-hole 41. However, since the arrayed signal through-hole 41 is formed in the opening 89 in the plane ground conductor layer 85, the return current flowing through the plane ground conductor layer 85 and reaching the opening 89 has nowhere to go. Thus, the return current flowing through the plane ground conductor layer 85 is accumulated around the opening 89 in the plane ground conductor 85, so that electrical potential varies. The return current flows into the additional ground through-hole 75 located nearby as a resultant uncoupled current. Further, the return current flowing through the plane ground conductor layer 83 flows using the electrostatic capacity, so that the potential around the opening 87 in the plane ground conductor layer 83 of the conductor layer 17 decreases. Then, the uncoupled current from the additional ground through-hole 75, located nearby, is supplied to the periphery of the opening 87 in the plane ground conductor layer 83 of the conductor layer 17.

Here, the term "uncoupled current" refers to current induced by a change in potential in the plane ground conductor layer caused by the return current.

It is found that the return currents flowing through the plane ground conductor layers 83 and 85, located immediately below the wiring, have a small inductance because their magnetic fields are closely coupled to the signal lines 79 and 81, provided across the thin insulator layer, whereas the uncoupled current has a large inductance because its coupling of magnetic field with a current flowing through the signal lines 79 and 81 is small. When inductance of the ground is large, ground noise becomes large. Therefore, it is newly found that the inductance of the ground can be reduced by arranging the additional ground through-hole 75, through which the return current flows, as close to the arrayed signal through-hole 41 connected to the signal lines 79 and 81 as possible. In this example, the plane ground conductor layers 83 and 85 are provided opposite the signal lines 79 and 81, respectively, but the above description also applies to the plane power conductor layers.

As described above, by providing the additional ground through-hole 75 and the additional power through-hole 77 between the pieces of the signal line area 67, it is possible to provide the additional ground through-hole 75 and the additional power through-hole 77 in the vicinity of the arrayed signal through-hole 41 to reduce the inductance of the uncoupled current and therefore, it is possible to reduce noise. Further, the additional ground through-hole 75 and the additional power through-hole 77 have no corresponding external terminals 55, thereby allowing the number of ground and power through-holes to be increased without increasing the number of external terminals 55. This eliminates the need to increase the size of the BGA semiconductor device to reduce the power and ground inductance.

Further, by locating the signal line area 67 outside the internal power area 65 in the core layer 7, the additional ground through-holes 75 and the additional power through-holes 77 can be arranged in the corners, outer periphery, and gaps between the internal power area 65 and each piece of the signal line area 67, thereby facilitating wiring design.

Furthermore, an output circuit in the semiconductor chip 1 comprises, for example, a switch A connecting the signal line and the power together and a switch B connecting the signal line and the ground together. To output a signal L, the switch B is connected, while the switch A is disconnected. To output a signal H, the switch A is connected, while the switch B is disconnected. Accordingly, when the signal is switched from H to L, the current path allows the charges accumulated in the electrostatic capacity in the signal line to escape to the ground, whereas the return current induced by the current flowing through the signal line flows to the ground. On the other hand, when the signal is switched from L to H, the electrostatic capacity in the signal line is charged, so that the return current induced by the current flowing through the signal line flows through the power conductor layer. Thus, to transmit the signal, the return current flows through both the ground and power conductor layer. Since the return current flows through both the ground and power conductor layer, when the number of power through-holes is substantially the same as that of ground through-holes like the semiconductor device according to the present embodiment, the inductance of the uncoupled current can be reduced both in the power conductor layer and in the ground conductor layer.

Moreover, if the ground conductor layer is used in place of the power conductor layer in all cases, when a large electrostatic capacity is provided between the power supply and ground of the output transistor in the semiconductor chip, an AC operation for switching the signal require the power supply and the ground to be short-circuited in an AC manner. This eliminates the need to distinguish between the power and the ground, but since the semiconductor chip preferably has a smaller area, a large electrostatic capacity may not be provided in the output circuit in the semiconductor chip. Furthermore, if the same base is used for various types of semiconductor chips, when the number of power through-holes is substantially the same as that of ground through-holes, semiconductor elements designed under different conditions can be used and this is preferable.

BGA semiconductor devices are widely used because they can accommodate a large number of signal lines and allow power impedance, which may cause electric noise, to be reduced by providing planar power and ground patterns.

Because of increasing operating frequency, electric noise is likely to occur even with a BGA semiconductor device. Accordingly, such a semiconductor device as described in JP-A-7-153869 has been proposed which has a large number of ground through-holes installed in the site of a band-shaped ground pattern in order to reduce possible electric noise.

When a large number of ground through-holes are provided, current flowing to the ground is dispersed. Therefore, it is possible to reduce the ground inductance, which may cause noise. However, when the operation becomes further faster, there is a case in which noise cannot be sufficiently reduced. Further, BGA semiconductor devices are suitable for accommodating a large number of signal lines, but for large-sized BGA semiconductor devices accommodating 1,000 or more signals, a large number of ground through-holes and a large number of external terminals connected to these ground through-holes contribute to increasing the mounting area of the BGA semiconductor device. Further, such a BGA semiconductor device and an electronic apparatus in which the BGA semiconductor device is mounted become expensive. These points are not considered in the proposed inventions.

The BGA semiconductor device can realize miniaturization and low cost if the BGA semiconductor device can densely accommodate as many signals as possible in order to effect the function of connecting to a substrate of an electronic apparatus and the semiconductor device to transmit signals. To achieve this, the number of external terminals for the power or ground may be reduced, but disadvantageously a decrease in number of external terminals for the power or ground increases the power or ground inductance and thus noise.

On the other hand, in the BGA semiconductor device of this embodiment, the base 5 has the front layers 9 and 11 installed on the respective sides of the core layer 7 structured by a printed circuit board and the semiconductor chip 1 is mounted the base and electrically connected thereto. The base 5 is also provided with the arrayed signal through-holes 41, arrayed power through-holes 43, and arrayed ground through-holes 45 corresponding to the arrays of external terminals 55 as well as the additional ground through-holes 75 and additional power through-holes 77 arranged away from the arrays of external terminals 55. The additional ground through-holes 75 and additional power through-holes 77 are thus arranged between the arrays of external terminals 55, so that the number of through-holes electrically connected to the power and ground can be increased and the inductance of the return current can be reduced.

Further, the arrayed signal through-holes 41 to be connected to signal lines in the semiconductor device are connected to the respective external terminals 55s, and the total number of arrayed power through-holes 43, arrayed ground through-holes 45, additional ground through-holes 75, and additional power through-holes 77 to be connected to the power or ground of the semiconductor device is larger than the total number of external power terminals 55V and external ground terminals 55g to be connected to the power or ground. By thus providing the additional ground through-holes 75 and the additional power through-holes 77, the inductance caused by return current flowing to the ground and power upon signal switching can be reduced without increasing the number of external terminals 55. Therefore, it is possible to reduce electrical noise. Further, since the number of external terminals 55 need not be increased, the need to increase the size of the semiconductor device is eliminated to suppress an increase in cost of the semiconductor device.

Furthermore, the additional ground through-holes 75 and additional power through-holes 77 can also be arranged on the diagonal lines of the base 5 and thus in the gaps between the arrayed signal through-holes 41, thereby facilitating wiring design.

Figure 5:
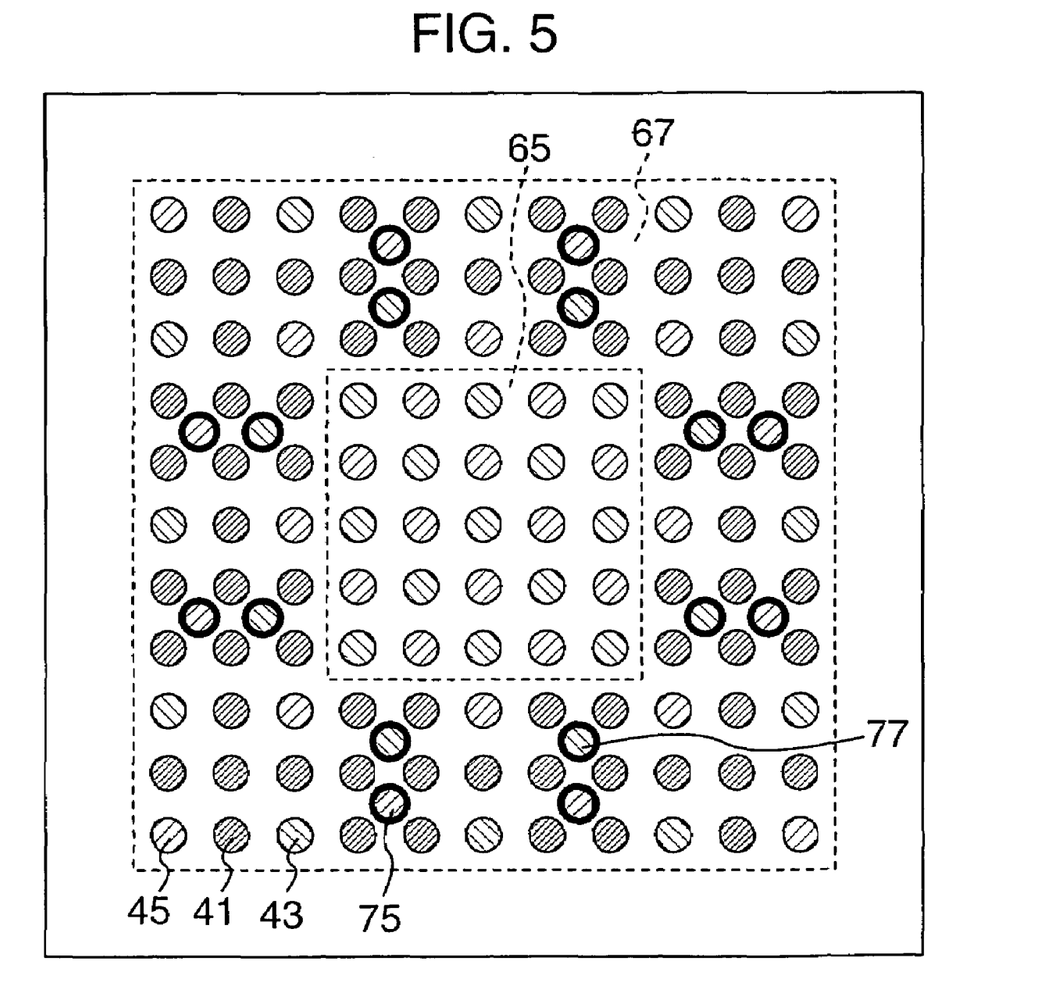
FIG. 5 is a horizontal sectional view schematically showing a configuration of a semiconductor device according to another embodiment of the present invention.

Further, the arrangement of the through-holes of the present invention can be arranged as shown in FIG. 5 instead of the arrangement of the through-holes of this embodiment. The sectional structure and the arrangement of the external terminals 55 are substantially the same as those of the embodiment, so that description thereof is omitted.

The through-holes in the semiconductor device according to the embodiment in FIG. 5 are arranged in a grid form in substantially the same as the arrangement of the external terminals 55. In the signal line area 67 with the through-holes installed therein in a grid form, the additional ground through-holes 75 and the additional power through-holes 77 are formed therein and the numbers of which are substantially the same. The additional power through-holes 77 are formed at substantially uniform intervals in the outer periphery of the additional signal through-holes 41 formed adjacent to the internal power area 65. The additional ground through-holes 75 are formed in the outer periphery of the additional power through-holes 77, formed in the outer periphery of the arrayed signal through-holes 41. In this case, the additional ground through-holes 75 and additional power through-holes 77 are each formed adjacent to the corresponding arrayed signal through-holes 41.

That is, if the signal line area 67, which surrounds the internal power area 65, is formed of three stages of an inner peripheral, a central peripheral, and an outer peripheral, then the additional power through-holes 77 are formed between the inner and central peripherals and the additional ground through-holes 75 are formed between the central and outer peripherals.

In other words, the signal line area 67 in which the through-holes arranged in a grid form is divided into three in the vertical direction and also into three in the horizontal direction, i.e. generally into nine, and the additional ground through-holes 75 and the additional power through-holes 77 are formed between the pieces of the divided signal line area 67, and one additional ground through-hole 75 and one additional power through-hole 77 are formed between each pair of pieces of the divided signal line area 67.

That is, the additional ground through-holes 75 are formed between the 1st and 2nd rows and between the 4th and 5th columns, between the 1st and 2nd rows and between the 7th and 8th columns, between the 4th and 5th rows and between the 1st and 2nd columns, between the 4th and 5th rows and between the 10th and 11th columns, between the 7th and 8th rows and between the 1st and 2nd columns, between the 7th and 8th rows and between the 10th and 11th columns, between the 10th and 11th rows and between the 4th and 5th columns, and between the 10th and 11th rows and between the 7th and 8th columns of the arranged through-holes.

The additional power through-holes 77 are formed between the 2nd and 3rd rows and between the 4th and 5th columns, between the 2nd and 3rd rows and between the 7th and 8th columns, between the 4th-and 5th rows and between the 2nd and 3rd columns, between the 4th and 5th rows and between the 9th and 10th columns, between the 7th and 8th rows and between the 2nd and 3rd columns, between the 7th and 8th rows and between the 9th and 10th columns, between the 9th and 10th rows and between the 4th and 5th columns, and between the 9th and 10th rows and between the 7th and 8th columns of the arranged through-holes.

By thus forming the additional ground through-holes 75 and additional power through-holes 77 near the arrayed signal through-holes 41, the inductance caused by uncoupled current flowing to the ground and power can be reduced. Further, by providing the additional ground through-holes and the additional power through-holes without increasing the number of external terminals 55, the inductance caused by return current flowing to the ground and power upon signal switching can be reduced to lessen possible electric noise. Furthermore, if the arrangement pitch of the through-holes is limited by the arrangement of the external terminals 55, the additional ground through-holes 75 and the additional power through-holes 77 can be formed between the arrayed signal through-holes 41 without changing the arrangement of the arrayed signal through-holes 41, arrayed power through-holes 43, and arrayed ground through-holes 45.

The semiconductor device of this embodiment is of the BGA type, but the present invention is not limited to BGA packages comprising a printed circuit board as the base 5. The present invention is also applicable to PGA or LGA semiconductor devices or the like which have surface grid terminals or area terminals. Further, the arrangement of the external terminals 55 is not limited to the grid form but may be a zigzag form.

Furthermore, the number of external terminals 55 of the semiconductor device is not limited to the one in the embodiment, but 32 rows×32 columns=1,024 pins, 40 rows×40 columns=1,600 pins, or the like may be selected as required. Even in such a case, the base may be divided into the internal signal area 65 and the signal line area 67, and the signal line area 67 may further be divided as required, so that the additional ground through-holes 76 and the additional power through-holes 77 may be formed in the periphery of each piece of the divided signal line area 67.

The base 5 is formed in the multiple layers including the core layer 7 and front layers 9 and 11, but the semiconductor device of the present invention is not limited to the configuration of the base 5 of this embodiment. The additional ground through-holes 75 and the additional power through-holes 77 may be formed in a multilayer circuit board such as a carrier circuit board of a BGA semiconductor device. The number of layers including the core layer 7 and front layers 9 and 11 may be selected as required depending on the number of external terminals 55 or the wiring of the circuit.

INDUSTRIAL APPLICABILITY

The present invention is applicable to a base comprising a multilayer substrate with a plurality of through-holes formed therein and to a semiconductor device having a semiconductor chip mounted on this base.

It should be further understood by those skilled in the art that the foregoing description has been made on embodiments of the invention and that various changes and modifications may be made in the invention without departing from the spirit of the invention and the scope of the appended claims.

The invention claimed is:

1. A semiconductor device, comprising:
   a base having front layers provided on respective sides of a core layer formed by a printed circuit board; and
   a semiconductor chip mounted on said base,
   wherein said semiconductor chip is joined to one of said front layers by using a joining member,
   the other front layer of said front layers has a plurality of external terminals arranged thereon,
   said core layer has a plurality of power through-holes and a plurality of ground through-holes each corresponding to one of said external terminals to electrically connect said semiconductor chip to said plurality of external terminals together, and
   said base including an internal power area at a central portion thereof and a signal line area formed around the internal power area,
   said internal power area, comprising an arrangement of first power through-holes and first ground through-holes in alternating fashion, the number of first power through-holes being substantially equal to the number of first ground through-holes,
   said signal line area, comprising a substantially equal number of second power through-holes and second ground through-holes,
   said signal line area further comprising a number of signal through-holes that is substantially equal to three times the total number of said second power through-holes and said second ground through-holes, said signal through-holes being disposed around said second power through-holes and said second ground through-holes in adjacent relation thereto,
   said signal line area further comprising one or more additional power through-holes or one or more additional ground through-holes disposed among said second power through-holes and said second ground through-holes, said additional power through-holes and said additional ground through-holes having no corresponding external terminals.

2. A semiconductor device, comprising:
   base having front layers provided on respective sides of a core layer formed by a printed circuit board; and
   a semiconductor chip mounted on said base,
   wherein said semiconductor chip is joined to one of said front layers using a joining member,
   the other front layer of said front layers has a plurality of external terminals arranged thereon,
   said core layer has a plurality of power through-holes and a plurality of ground through-holes each corresponding to one of said external terminals to electrically connect said semiconductor chip to said plurality of external terminals, and
   said base including an internal power area at a central portion thereof and a signal line area formed around the internal power area,
   said internal power area, comprising an arrangement of first power through-holes and first ground through-holes in alternating fashion, the number of first power through-holes being substantially equal to the number of first ground through-holes,
   said signal line area, comprising a substantially equal number of second power through-holes and second ground through-holes,
   said signal line area further comprising a number of signal through-holes that is substantially equal to three times the total number of said second power through-holes and said second ground through-holes, said signal through-holes being disposed around said second power through-holes and said second ground through-holes in adjacent relation thereto,
   said signal line area further comprising one or more additional power through-holes or one or more additional ground through-holes disposed betweeb said internal power area and said signal line area, said additional power through-holes and said additional ground through-holes having no corresponding external terminals.

3. The semiconductor device according to claim 1, wherein either said additional power through-holes or said additional ground through-holes are provided close to diagonal lines of said core layer shaped like a general rectangle.

4. The semiconductor device according to claim 2, wherein either said additional power through-holes or said additional ground through-holes are provided close diagonal lines of said core layer shaped like a general rectangle.

* * * * *